(12) United States Patent
Eromäki (10) Patent No.: US 9,685,732 B2
(45) Date of Patent: Jun. 20, 2017

(54) APPARATUS FOR MOVING A CARRIER (71) Applicant: Microsoft Technology Licensing, LLC, Redmond, WA (US)

(72) Inventor: Marko Eromäki, Tampere (FI)

(73) Assignee: Microsoft Technology Licensing, LLC, Redmond, WA (US)

( * ) Notice: Subject to any disclaimer, the term of this patent is extended or adjusted under 35 U.S.C. 154(b) by 0 days.

(21) Appl. No.: 14/720,909

(22) Filed: May 25, 2015

(65) Prior Publication Data
US 2016/0352043 A1 Dec. 1, 2016

(51) Int. Cl.
| | |
|---|---|
| *A47B 95/00* | (2006.01) |
| *H01R 13/62* | (2006.01) |
| *H05K 5/02* | (2006.01) |
| *G06F 1/16* | (2006.01) |
| *H04B 1/3818* | (2015.01) |
| *H05K 7/14* | (2006.01) |
| *G06K 13/08* | (2006.01) |

(Continued)

(52) U.S. Cl.
CPC ....... *H01R 13/6205* (2013.01); *G06F 1/1656* (2013.01); *H04B 1/3818* (2015.01); *H05K 5/0221* (2013.01); *H05K 5/0286* (2013.01); *H05K 5/0295* (2013.01); *H05K 7/1401* (2013.01); *G06K 13/08* (2013.01); *G11B 17/04* (2013.01); *H04M 1/026* (2013.01); *Y10T 292/11* (2015.04)

(58) Field of Classification Search
CPC ............... G06K 13/0831; G06K 13/08; G06K 13/0806; G06K 13/0843; G06K 13/0812; G06K 13/0825; H04B 1/3816; E05C 19/16

USPC ...................................................... 292/251.5
See application file for complete search history.

(56) References Cited

U.S. PATENT DOCUMENTS

| | | | |
|---|---|---|---|
| 3,790,197 A * | 2/1974 | Parker ..................... | E05C 19/16 292/251.5 |
| 6,366,440 B1 * | 4/2002 | Kung ...................... | E05C 19/16 361/147 |
| 6,561,851 B2 | 5/2003 | Florescu | |

(Continued)

FOREIGN PATENT DOCUMENTS

| | | |
|---|---|---|
| CN | 102709746 A | 10/2012 |
| CN | 203574181 U | 4/2014 |

(Continued)

OTHER PUBLICATIONS

"Sim Card Reader, With Removable Tray", Published on: Jul. 20, 2014 Available at: http://www.yamaichi.de/products/connector-solutions/card-connectors/sim/sim-card-reader-with-removable-tray.html.

(Continued)

*Primary Examiner* — Daniel J Troy
*Assistant Examiner* — Andres F Gallego (57) ABSTRACT

An apparatus for moving a carrier includes a housing and a carrier having a retracted closed position and an ejected open position with respect to the housing. The carrier includes a first magnet and a second magnet. A latch is provided having two states and having a third magnet located between the first magnet and the second magnet. In a first state, the carrier is in the retracted closed position due to a magnetic coupling between the first magnet and the third magnet. In a second state, the carrier is in the ejected open position due to a magnetic coupling between the second magnet and the third magnet.

19 Claims, 5 Drawing Sheets

(51) Int. Cl.
*G11B 17/04* (2006.01)
*H04M 1/02* (2006.01)

(56) References Cited

U.S. PATENT DOCUMENTS

| | | | |
|---|---|---|---|
| 6,974,338 B1 | 12/2005 | Hasegawa | |
| 7,442,086 B1 | 10/2008 | Chang | |
| 7,661,732 B2* | 2/2010 | Hsu | H04M 1/0245 |
| | | | 292/251.5 |
| 8,553,419 B2 | 10/2013 | Luo et al. | |
| 8,591,240 B2 | 11/2013 | Jenks | |
| 8,625,287 B2 | 1/2014 | Liu et al. | |
| 8,777,645 B2 | 7/2014 | Cao | |
| 9,101,052 B2* | 8/2015 | Chou | H05K 5/0217 |
| 9,337,575 B1* | 5/2016 | Chang | G06K 13/08 |
| 2006/0006674 A1* | 1/2006 | Kang | E05C 19/16 |
| | | | 292/251.5 |
| 2007/0133156 A1* | 6/2007 | Ligtenberg | G06F 1/1616 |
| | | | 361/679.27 |
| 2008/0061565 A1* | 3/2008 | Lee | E05C 19/16 |
| | | | 292/251.5 |
| 2010/0194503 A1* | 8/2010 | Eromaki | H04M 1/0237 |
| | | | 335/219 |
| 2010/0309627 A1 | 12/2010 | Noma et al. | |
| 2013/0063910 A1 | 3/2013 | Chao et al. | |
| 2013/0258605 A1 | 10/2013 | Hsu | |
| 2013/0334948 A1 | 12/2013 | Chung et al. | |
| 2014/0177144 A1* | 6/2014 | Wu | G06F 1/1613 |
| | | | 361/679.01 |
| 2014/0306463 A1* | 10/2014 | Ho | E05C 19/16 |
| | | | 292/251.5 |
| 2015/0004818 A1 | 1/2015 | Huang et al. | |
| 2015/0118884 A1* | 4/2015 | Hu | H04B 1/3816 |
| | | | 439/310 |

FOREIGN PATENT DOCUMENTS

| | | |
|---|---|---|
| WO | 02054713 A2 | 7/2002 |
| WO | 2013182106 A2 | 12/2013 |

OTHER PUBLICATIONS

"International Search Report and Written Opinion Issued in PCT Application No. PCT/US2016/029278", Mailed Date: Aug. 30, 2016, 11 Pages.

* cited by examiner

APPARATUS FOR MOVING A CARRIER

BACKGROUND

Many pieces of existing electronic equipment that people use, for example for interactions, navigation, identification, etc., may comprise an apparatus for moving a removable data storage medium. The apparatus may also move some other type of device, which is needed to be hidden or out of the way during normal operation of the electronic equipment.

SUMMARY

This Summary is provided to introduce a selection of concepts in a simplified form that are further described below in the Detailed Description. This summary is not intended to identify key features or essential features of the claimed subject matter, nor is it intended to be used to limit the scope of the claimed subject matter.

An apparatus comprises a housing, a carrier having a retracted closed position and an ejected open position with respect to the housing, wherein the carrier comprises a first magnet and a second magnet. Further, the apparatus comprises a latch having two states and having a third magnet located between the first magnet and the second magnet, wherein in a first state the carrier is in the retracted closed position due to a magnetic coupling between the first magnet and the third magnet, and in a second state the carrier is in the ejected open position due to a magnetic coupling between the second magnet and the third magnet.

Many of the attendant features will be more readily appreciated as they become better understood by reference to the following detailed description considered in connection with the accompanying drawings.

DESCRIPTION OF THE DRAWINGS

The present description will be better understood from the following detailed description read in light of the accompanying drawings, wherein.

Like reference numerals are used to designate like parts in the accompanying drawings.

DETAILED DESCRIPTION

The detailed description provided below in connection with the appended drawings is intended as a description of the present examples and is not intended to represent the only forms in which the present example may be constructed or utilized. However, the same or equivalent functions and sequences may be accomplished by different examples.

Mobile wireless devices, such as mobile phones, laptops, tablets, smart watches and other smart wearables or cars with an on-board navigational system may need a removable data storage medium, such as an integrated circuit card. Sometimes an integrated circuit card is called a smart card, such as a Subscriber Identity Module card (SIM card), a memory card, such as a Secure Digital card (SD card), an identity card or a card which is suitable for paying purchases. In some electronic equipment, such as in games consoles, the removable data storage medium may be a compact disc (CD) or a digital versatile disc (DVD). Some pieces of electronic equipment using a removable data storage medium may also accept more than one removable data storage medium. In smart phones, equipped with (a) camera(s), it may be advantageous that an auxiliary device, such as a flash, can be ejected outwards from the smart phone when a picture is needed to be taken. Correspondingly, the flash would be hidden when no camera is needed. The ejecting flash would also operate as a flashlight when continuous operation of the light of the flash is enabled. In some devices, electric signals are needed for moving the removable data storage medium or the auxiliary device.

Figure 1A:
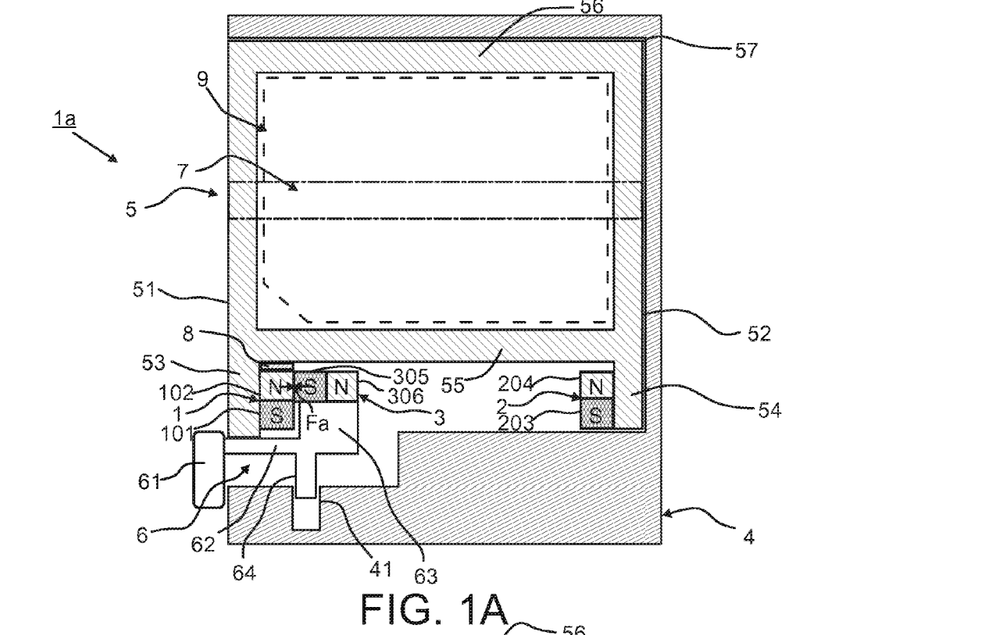
FIG. 1A is a schematical example illustration of an apparatus where a carrier is in a retracted closed position and where a latch is in a first state.

FIG. 1A is a schematical example illustration of an apparatus 1a where a carrier 5 is in a retracted closed position and where a latch 6 is in a first state. FIG. 1A shows a view from the top of the apparatus 1a. The apparatus 1a comprises a housing 4. The apparatus 1a further comprises a carrier 5 having a retracted closed position and an ejected open position with respect to the housing 4. The carrier 5 comprises a first magnet 1 and a second magnet 2. The apparatus 1a further comprises a latch 6 having two states. The latch 6 comprises also a third magnet 3. The third magnet 3 is attached to the latch 6 and arranged between the first magnet 1 and the second magnet 2. As disclosed in FIG. 1A, the first magnet 1 of the carrier 5 is magnetically coupled with the third magnet 3 of the latch 6. The latch 6 is configured to move transversely in relation to the reciprocating direction of motion of the carrier 5 between the first state and the second state. The latch 6 is configured to cause ejection of the carrier 5 to the ejected open position when the similar poles of the first magnet 1 and the third magnet 3 are caused to face each other, and the latch 6 is configured to cause retraction of the carrier 5 when the similar poles of the second magnet 2 and the third magnet 3 are caused to face each other. If the carrier 5 carries a card, the carrier 5 may comprise a rectangular structure 57. In this case the carrier 5 is a card carrier. If the carrier 5 carries a CD or a DVD, the carrier 5 may be structured substantially circular to receive the CD or the DVD (not illustrated in FIG. 1A).

The first magnet 1 comprises a first magnetic pole element 101 and a second magnetic pole element 102. The first magnet 1 may be attached to a front portion 51 of the carrier 5. The second magnetic pole element 102 may be located between the carrier 5 and the first magnetic pole element 101. In one example the second magnetic pole 102 is formed as the magnetic north pole N and the first magnetic pole element 101 is formed as the magnetic south pole S. The latch 6 comprises an arm 62, which comprises an extension 63. The third magnet 3 may be attached to the extension 63 of the latch 6. The third magnet 3 comprises a fifth magnetic pole element 305 and a sixth magnetic pole element 306. In one example the fifth magnetic pole element 305 is arranged closer to the front portion 51 than the sixth magnetic pole element 306. FIG. 1A illustrates an example where the fifth magnetic pole element 305 is the magnetic south pole S and the sixth magnetic pole element 306 is the magnetic north pole N. The fifth magnetic pole element 305 and sixth magnetic pole element 306 may be attached side by side to the latch 6. In a back portion 52 of the carrier 5 the second magnet 2 is arranged similarly as the first magnet 1. The second magnet 2 comprises a third magnetic pole element 203 and a fourth magnetic pole element 204. The fourth magnetic pole element 204, being the magnetic north pole N, is located between the third magnetic pole element 203, being the magnetic south pole S, and the carrier 5. Naturally, it is also possible to configure the polarity of the magnets 1, 2, 3 in the opposite way than what is illustrated in FIG. 1A.

FIG. 1A discloses the first state of the latch 6. In the first state, the fifth magnetic pole element 305 is coupled with the second magnetic pole element 102 due to the attractive magnetic force Fa. In FIG. 1A, both the carrier 5 and the latch 6 are in an unmoved position. The position of the apparatus 1a illustrated in FIG. 1A is an initial position where the carrier 5 remains unmoved and a removable data storage medium 9 or an auxiliary device (not illustrated in FIG. 1A) also remains unmoved inside the apparatus 1a. The carrier 5 may be structured to releasably receive at least one removable data storage medium 9, such as an integrated circuit card. The housing 4 comprises at least one guide element 7 configured to connect the carrier 5 to the housing 4 in a slidable manner. The housing 4 may comprise a stationary guide 8 that limits the transverse movement of the carrier 5 in relation to the reciprocating direction of motion of the carrier 5. If the movement of the carrier 5 is limited only to the opening and closing direction of the carrier 5 by other means, the stationary guide 8 may be left out from the structure of the apparatus 1a.

Figure 1B:
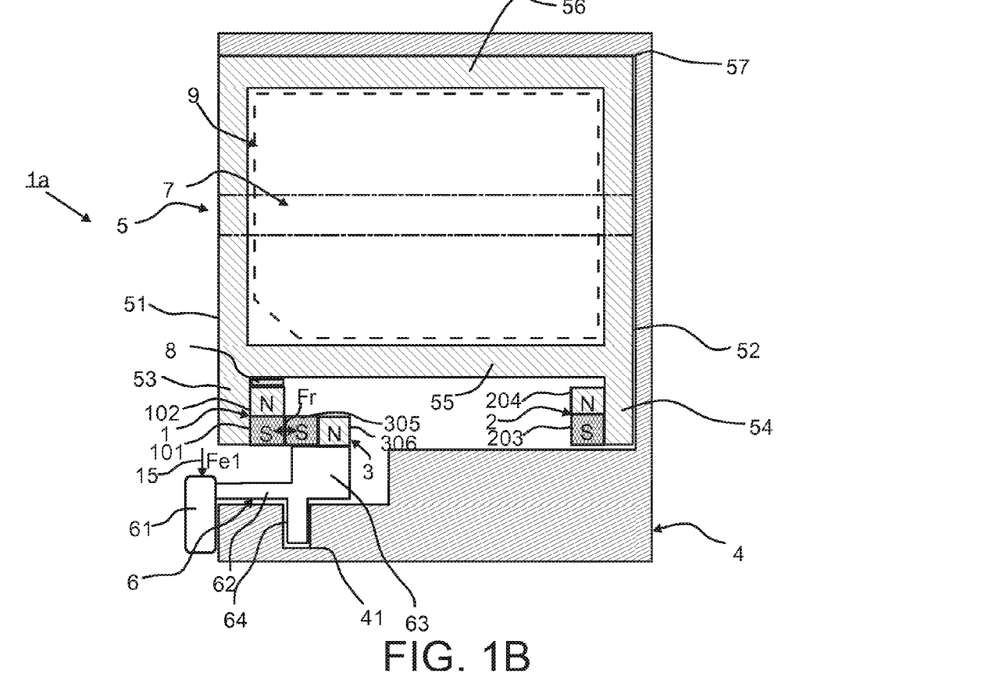
FIG. 1B is a schematical example illustration of an apparatus where a carrier is in a retracted closed position and where a latch has moved to a second state.
Figure 2A:
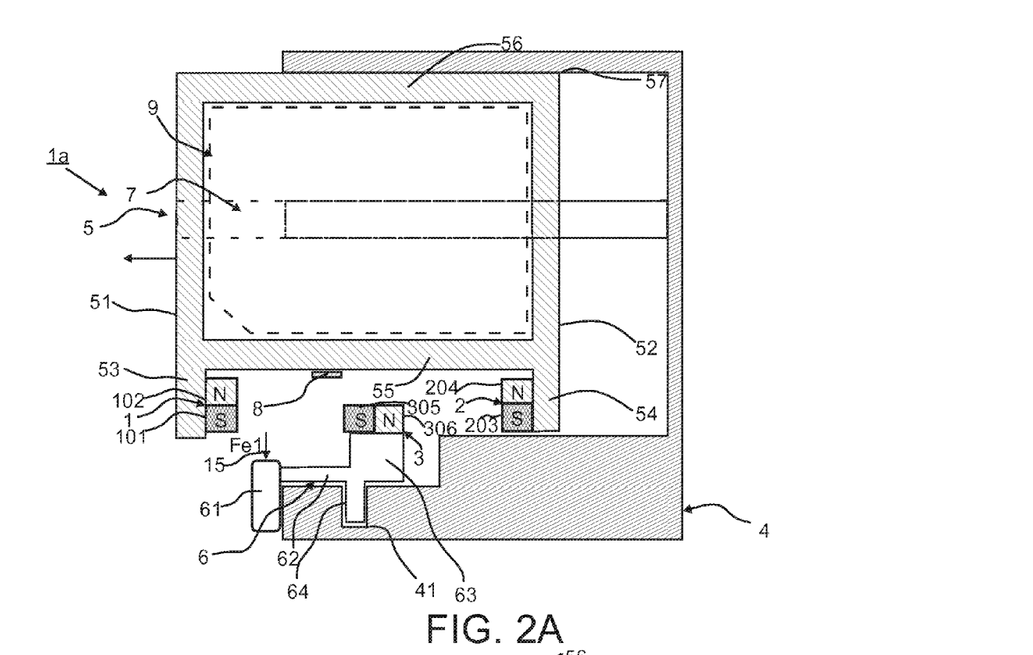
FIG. 2A is a schematical example illustration of an apparatus where a carrier is moving to an ejected open position.

FIG. 1B is a schematical example illustration of the apparatus 1a where the carrier 5 is in a retracted closed position and the latch 6 has moved to the second state. FIG. 2A is a schematical example illustration of the apparatus 1a where the carrier 5 is moving to the ejected open position.

The latch 6 comprises an operating element 61 which enables the latch 6 to be moved between the first state and the second state due to an external force Fe1 applied to the operating element. The arm portion 62 extends from the operating element 61 inside the housing 4 in parallel to the carrier 5. The latch 6 comprises an operating element 61 which enables the latch 6 to be moved between the first state and the second state due to an external force Fe1 applied to the operating element 61. In the examples in FIG. 1B and FIG. 2A the latch 6 has been moved in the second state by a user pushing the operating element 61 with the external force Fe1 in the direction of the arrow 15. FIG. 1B illustrates an example where the latch 6 has been switched from the first state to the second state. The fifth magnetic pole element 305 is first caused to face the first magnetic pole element 101 causing ejection of the carrier 5 due to a repelling magnetic force Fr between the fifth magnetic pole element 305 and the first magnetic pole element 101. This substantially strong repelling magnetic force Fr ejects the carrier 5 outwards. FIG. 2A illustrates the carrier 5 in motion. After a certain travel, for example 50% of the total stroke, the second magnet 2 on the carrier 5 starts to attract the third magnet 3 on the latch 6 and generate an attractive magnetic force for the carrier 5.

Figure 2B:
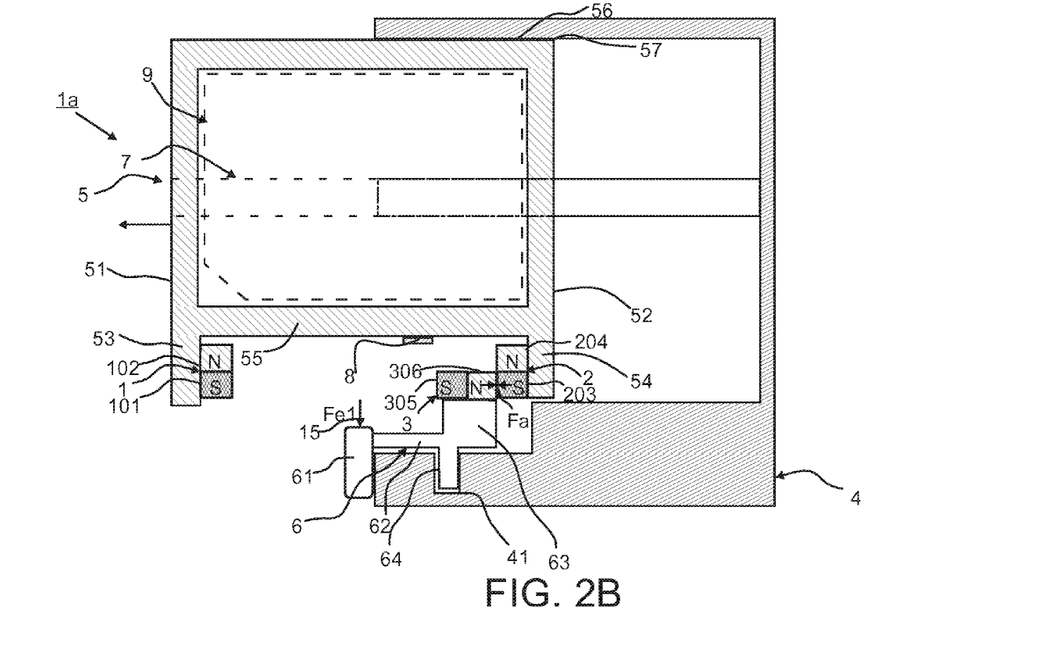
FIG. 2B is a schematical example illustration of an apparatus where a carrier is in an ejected open position.

FIG. 2B is a schematical example illustration of the apparatus 1a where the carrier 5 is in an ejected open position. The carrier 5 is caused to move to the ejected open position due to an attractive magnetic force Fa between the third magnetic pole element 203 and the sixth magnetic pole element 306. In the ejected open position the movement is finished and the carrier 5 is locked to the ejected open position.

Figure 3:
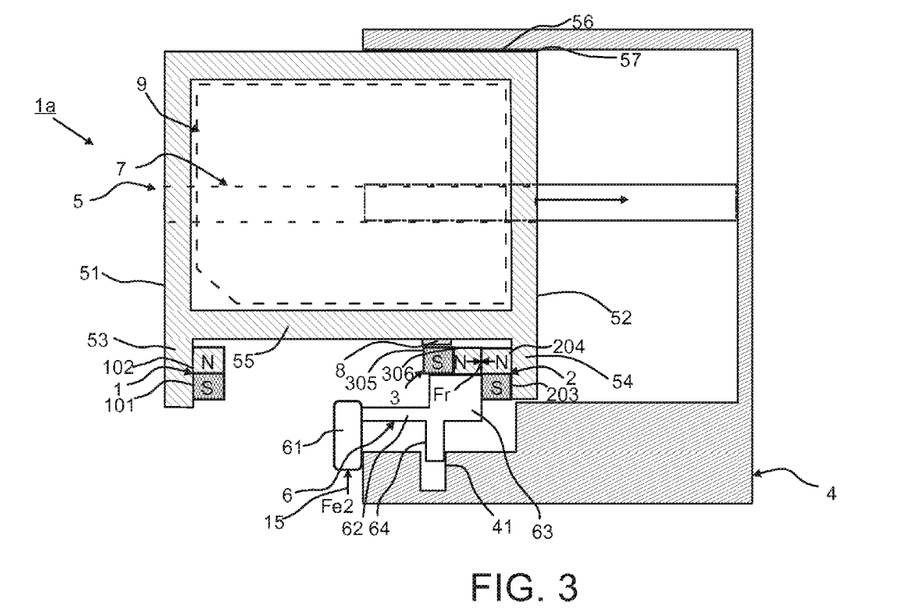
FIG. 3 is a schematical example illustration of an apparatus where a carrier is in an ejected open position and where a latch has moved to a second state.

FIG. 3 is a schematical example illustration of the apparatus 1a where a carrier 5 is in the ejected open position and where the latch 6 has been moved from the second state to the first state. In the example of FIG. 3, the latch 6 has been moved to the second state by a user pushing the operating element 61 with an external force Fe2 in the direction of the arrow 15. After switching from the second state to the first state, the sixth magnetic pole element 306 is caused to face the fourth magnetic pole element 204 causing retraction of the carrier 5 due to a repelling magnetic force Fr between the sixth magnetic pole element 306 and the fourth magnetic pole element 204. The carrier 5 then moves back to the retracted closed position illustrated in FIG. 1A. The carrier 5 is caused to move to the retracted closed position due to an attractive magnetic force Fa between the fifth magnetic pole element 305 and the second magnetic pole element 102 as disclosed in FIG. 1A.

Figure 4:
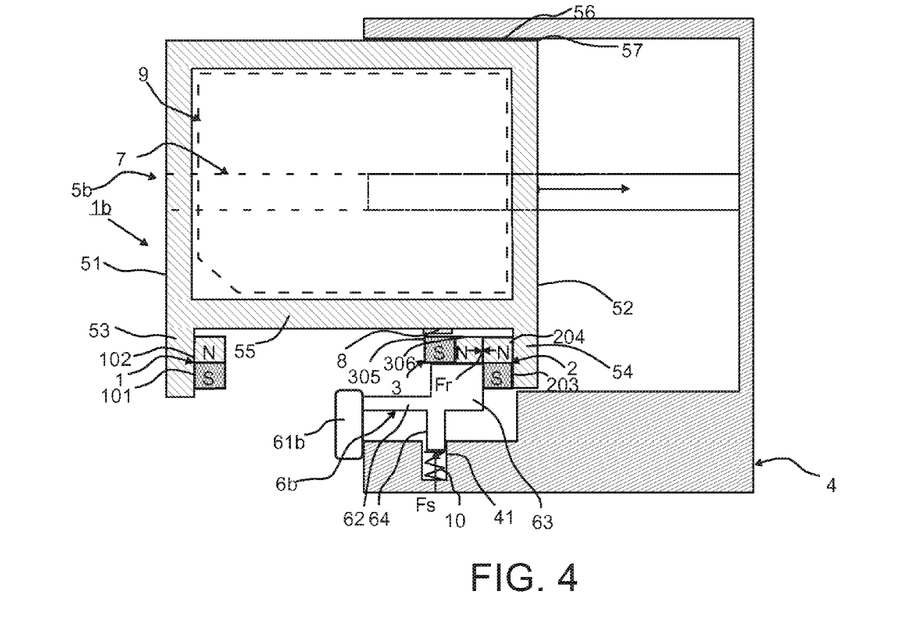
FIG. 4 is a schematical example illustration of an apparatus where a carrier is in an ejected open position.

FIG. 4 is a schematical example illustration of an apparatus 1b where a carrier 5b is in an ejected open position. The apparatus 1b in FIG. 4 is similar to the apparatus 1a in FIG. 3 with the exception that no external force of a user is needed for moving the latch 6b from the second state back to the first state. In the example of FIG. 4 the latch 6b is returned back to the first state by a spring 10. The latch 6b of the apparatus 1b comprises an operating element 61b, which enable the latch 6b to be moved to the second state by an external force applied to the operating element 61b. When the user stops applying the external force on the operating element 61, the latch 6b is returned back to the first state with the spring force Fs of the spring 10. The apparatus 1b is thereby spring assisted.

Figure 5:
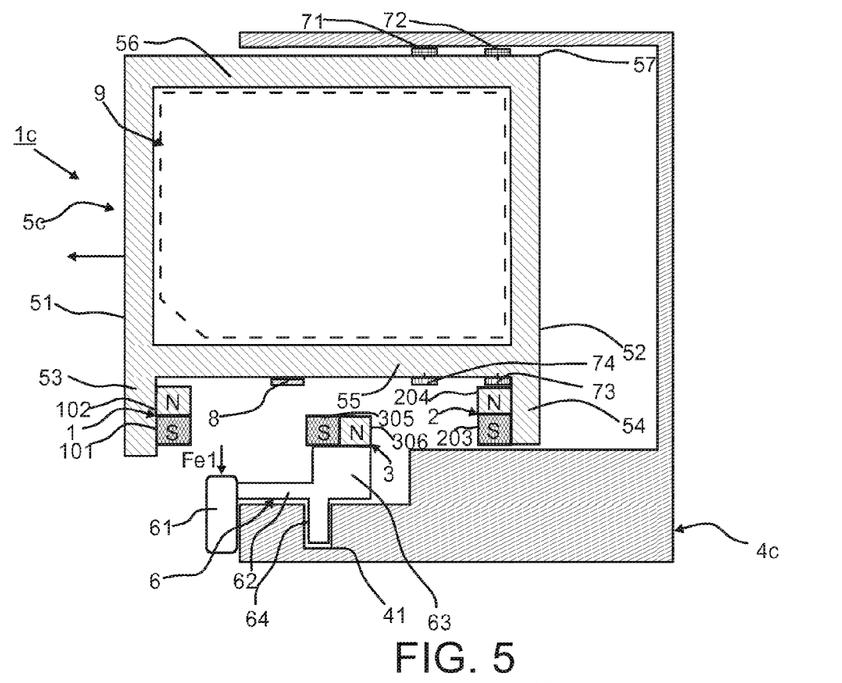
FIG. 5 is a schematical example illustration of an apparatus where a carrier is moving to an ejected open position.

FIG. 5 is a schematical example illustration of an apparatus 1c where a carrier 5c is moving to an ejected open position. The apparatus 1c in FIG. 5 is similar to the apparatus 1a in FIG. 2A with the exception that the apparatus 1c is equipped with roller elements 71, 72, 73, 74 instead of at least one guide. The roller elements 71, 72, 73, 74 may be attached to the sides 55, 56 of the carrier 5c by shafts. In another example, the roller elements 71, 72, 73, 74 may be structured below the carrier 5c (not illustrated in FIG. 5). The roller elements 71, 72, 73, 74 enable the carrier 5c to be connected to the housing 4c in a movable manner. Further, in another example, the apparatus 1c may comprise only one wider roller element, and the wider roller element may be attached below and in the middle of the carrier 5c (not illustrated in FIG. 5).

Figure 6:
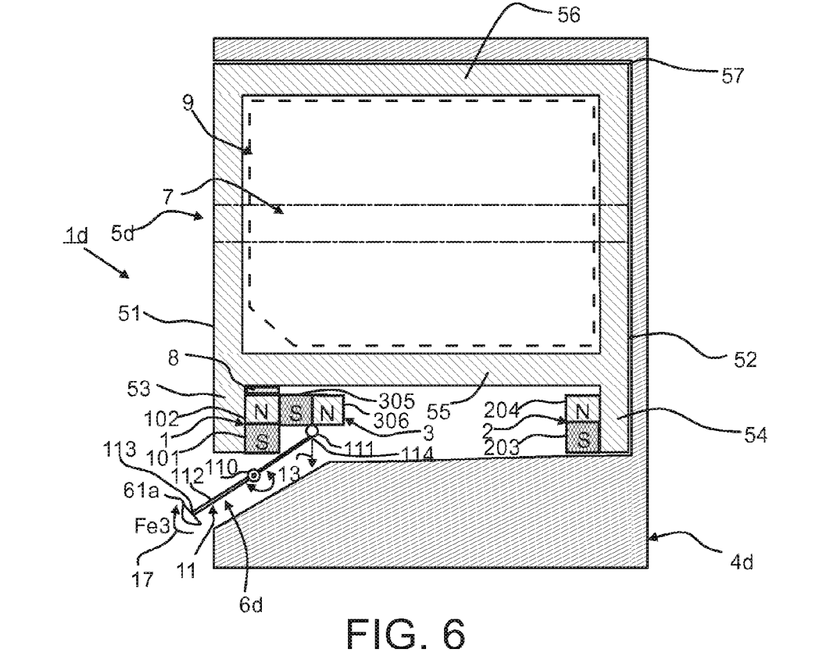
FIG. 6 is a schematical example illustration of an apparatus where a carrier is in a retracted closed position and where a latch is in a first state.

FIG. 6 is a schematical example illustration of an apparatus 1d where a carrier 5d is in a retracted closed position and where a latch 6d is in a first state. The apparatus 1d in FIG. 6 is similar to the apparatus 1a in FIG. 1A with the exception that a pivoting member 11 is configured to function as the latch 6d. The latch 6d comprises the pivoting member 11 which enables the latch 6d to be moved between the first state and the second state due to an external force Fe3 applied to the pivoting member 11. The pivoting member 11 comprises at least one joint 110, 111, which enables the rotation of the pivoting member 11. The pivoting member 11 may comprise a first joint 110 and a second joint 111 that enable the movement of the third magnet 3 in the transversal direction in relation to the reciprocating direction of motion of the carrier 5*d*. The first joint 110 enables the rotation of an arm 112 of the pivoting member 11. The arm 112 comprises a first end 113 and a second end 114. At the first end 113, an operating element 61*a* is attached. At the second end 114, a second joint 111 is attached. For example, when the user moves the pivoting member 11 in the direction of the first arrow 17, the third magnet 3 moves in the direction of the second arrow 13.

Figure 7:
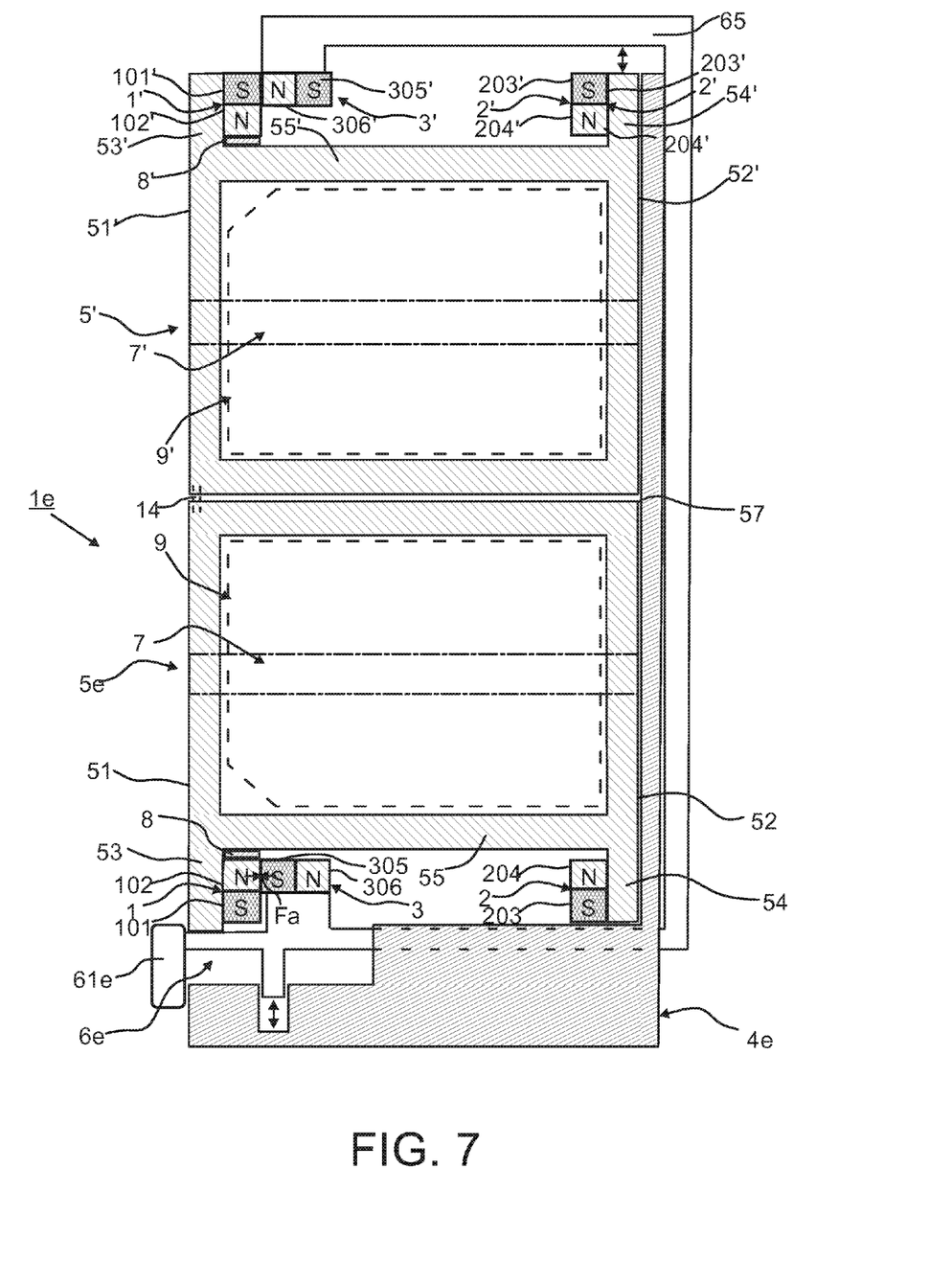
FIG. 7 is a schematical example illustration of an apparatus where two carriers are in a retracted closed position.

FIG. 7 is a schematical example illustration of an apparatus 1*e* where two carriers 5*e*, 5' are in a retracted closed position. The apparatus 1*e* in FIG. 7 is similar to the apparatus 1*a* in FIG. 1A with the exception that there is a second carrier 5' in addition to a first carrier 5*e* and with another exception that a latch 6*e* is equipped with a fourth magnet 3' in addition to the third magnet 3. The fourth magnet 3' is connected to the latch 6*e* with an extension 65. For example, when the latch 6*e* is moved to the second state, also the fourth magnet 3' is moved because it is attached to the latch 6*e* via the extension 65. When the third magnet 3 is moved to the second state, also the fourth magnet 3' moves. The polarity of the fourth magnet 3' is opposite to that of the third magnet 3. When the third magnet 3 of the latch 6*e* moves to the second state, both carriers 5*e*, 5' are ejected. The carriers 5*e*, 5' may also be interconnected in the middle 14.

The apparatus 1*a*, 1*b*, 1*c*, 1*d* disclosed in the above examples has a simple and reliable structure. For example, the magnets 1, 2, 3, 3' used in the apparatus 1*a*, 1*b*, 1*c*, 1*d*, 1*e* may be neodymium magnets. The neodymium is an alloy made of iron and boron. Because the neodymium magnet has greater strength in the magnetic force, it allows the use of smaller, lighter magnets for a given application, for example in the examples presented above.

Some existing solutions require electric signals for moving the carrier. These solutions may require an electric motor or a complicated spring mechanism in order to eject the carrier. Electric motors or other electric ejecting mechanisms are expensive to manufacture and in course of time may require maintenance. In the examples presented above, no electric signals are needed for ejecting the carrier 5, 5*b*, 5*c*, 5*d*, 5*e*, 5'. Further, the magnets 1, 2, 3, 3' are reliable and easy to operate.

The apparatus 1*a*, 1*b*, 1*c*, 1*d*, 1*e* disclosed in the examples above is useful in a solution where the apparatus 1*a*, 1*b*, 1*c*, 1*d*, 1*e* is used as a card connector for an electronic communication device, such as a smart phone or a tablet computer.

Although FIGS. 1A-7 describe that the apparatus 1*a*, 1*b*, 1*c*, 1*d*, 1*e* is equipped with the stationary guide 8, it may be left out from the structure of the apparatus 1*a*, 1*b*, 1*c*, 1*d*, 1*e* if the guide function is arranged in some other way. The at least one guide element 7, 7' may be structured in such a way that it enables the reciprocating movement of the carrier 5, 5*b*, 5*d*, 5*e*, 5' but limits the movement in other directions, in which case the stationary guide 8 may be left out from the structure of the apparatus 1*a*, 1*b*, 1*d*, 1*e*.

The apparatus 1*a*, 1*b*, 1*c*, 1*d*, 1*e* disclosed in the examples above may be used when the electronic communication device utilizes a removable data storage medium. The removable data storage medium 9, 9' may be a subscriber identity module card (SIM card), a full-size SIM 1st form factor (1FF) card, a mini-SIM 2nd form factor (2FF) card, a micro-SIM 3rd form-factor (3FF) card, a nano-SIM 4th form-factor (4FF) card, a secure digital card (SD card), a mini secure digital card (miniSD card), a micro secure digital card (microSD card), a memory card, a storage card, an expanded external memory card, a compact disc, a digital versatile disc or a Blue-ray Disc.

Although FIGS. 1A-7 describe that the apparatus 1*a*, 1*b*, 1*c*, 1*d*, 1*e* is suitable for receiving a data storage medium 7, the apparatus 1*a*, 1*b*, 1*c*, 1*d*, 1*e* may be used to eject also other types of devices additionally or alternatively. For example, the apparatus 1*a*, 1*b*, 1*c*, 1*d*, 1*e* disclosed in the examples above may be used to eject a flash of an electronic apparatus, for example, a digital camera or a smart phone.

Although FIGS. 1A-7 describe the apparatus 1*a*, 1*b*, 1*c*, 1*d*, 1*e* equipped with one magnet in three locations of the apparatus 1*a*, 1*b*, 1*c*, 1*d*, 1*e*, the apparatus 1*a*, 1*b*, 1*c*, 1*d*, 1*e* may have a set of magnets in each three locations of the apparatus 1*a*, 1*b*, 1*c*, 1*d*, 1*e* to increase the magnetic force.

An embodiment of an apparatus comprises a housing; a carrier having a retracted closed position and an ejected open position with respect to the housing, wherein the carrier comprises a first magnet and a second magnet; and a latch having two states and having a third magnet located between the first magnet and the second magnet; wherein in a first state of the latch the carrier is in the retracted closed position due to a magnetic coupling between the first magnet and the third magnet, and in a second state of the latch the carrier is in the ejected open position due to a magnetic coupling between the second magnet and the third magnet.

In one example, the housing comprises at least one guide element configured to connect the carrier to the housing in a slidable manner.

In one example, the apparatus comprises at least one roller element configured to connect the carrier to the housing in a movable manner.

In one example, the carrier comprises a front portion and a back portion, wherein a first magnet is located in the front portion, the first magnet comprising a first magnetic pole element and a second magnetic pole element, wherein the first magnetic pole element has an adverse magnetic polarity to that of the second magnetic pole element, wherein the second magnetic pole element is located between the first magnetic pole element and the carrier, wherein the second magnet is located in the back portion, the second magnet comprising a third magnetic pole element and a fourth magnetic pole element, wherein the third magnetic pole element has an adverse magnetic polarity to that of the fourth magnetic pole element, wherein the fourth magnetic pole element is located between the third magnetic pole element and the carrier; and wherein the third magnet comprises a fifth magnetic pole element and a sixth magnetic pole element, wherein the fifth magnetic pole element has an adverse magnetic polarity to that of the sixth magnetic pole element, wherein the fifth magnetic pole element and the sixth magnetic pole element are attached side by side to the latch.

In one example, the second magnetic pole element, the fourth magnetic pole element and the sixth magnetic pole element are magnetic north poles.

In one example, the first magnetic pole element, the third magnetic pole element and the fifth magnetic pole element are magnetic north poles.

In one example, when the latch switches from the first state to the second state, the fifth magnetic pole element is caused to face the first magnetic pole element causing ejection of the carrier due to a repelling magnetic force between the fifth magnetic pole element and the first magnetic pole element, and the carrier is caused to move to the ejected open position due to an attractive magnetic force between the third magnetic pole element and the sixth magnetic pole element.

In one example, after the state transition from the first state to the second state of the latch, the fifth magnetic pole element is coupled to the first magnetic pole element causing ejection of the carrier due to a repelling magnetic force, wherein at the end of the ejected open position the third magnetic pole element is coupled to the sixth magnetic pole element due to an attractive magnetic force.

In one example, wherein when the latch is switched from the second state to the first state, the sixth magnetic pole element is caused to face the fourth magnetic pole element causing retracting of the carrier due to a repelling magnetic force between the sixth magnetic pole element and the fourth magnetic pole element, and the carrier is caused to move to the retracted closed position due to an attractive magnetic force between the fifth magnetic pole element and the second magnetic pole element.

In one example, the latch is configured to move transversely in relation to the reciprocating direction of motion of the carrier between the first state and the second state causing the carrier to move to the retracted closed position or to the ejected open position due to a magnetic force.

In one example, the latch comprises an operating element which enables the latch to be moved between the first state and the second state due to an external force applied to the operating element.

In one example, the latch is configured to move sideways between the first state and the second state causing the carrier to move into the retracted closed position or into the extracted open position due to a repelling magnetic force.

In one example, the latch is configured to lock the carrier into the retracted closed position or into the ejected open position due to an attractive magnetic force.

In one example, the latch comprises an arm portion extending from the operating element inside the housing in parallel to the carrier, wherein the third magnet is attached to the arm portion.

In one example, the latch comprises an operating element and a spring which enable the latch to be moved to the second state by an external force applied to the operating element and returned to the first state by the spring force of the spring.

In one example, the latch comprises a pivoting member which enables the latch to be moved between the first state and the second state due to an external force applied to the pivoting member.

In one example, the carrier comprises a card carrier.

In one example, the carrier is structured to releasably receive at least one removable data storage medium.

In one example, the carrier is structured to releasably receive at least one of an integrated circuit card, a subscriber identity module card, a secure digital card, a memory card, a storage card, an expanded external memory card, a compact disc, a digital versatile disc and a Blue-ray Disc.

In one example, the apparatus is a card connector for an electronic communication device.

In one example, an electronic device comprises the apparatus.

In one example, the apparatus further comprises an electronic device, the electronic device comprising the carrier, the latch, the first magnet, the second magnet and the third magnet.

An embodiment of an electronic apparatus comprises a housing. The electronic apparatus comprises a carrier configured to carry at least one removable data storage medium, the carrier having a retracted closed position and an ejected open position with respect to the housing, wherein the carrier comprises a first magnet and a second magnet; and a latch having two states and having a third magnet located between the first magnet and the second magnet; wherein in a first state of the latch the carrier is in the retracted closed position due to a magnetic coupling between the first magnet and the third magnet, and in a second state of the latch the carrier is in the ejected open position due to a magnetic coupling between the second magnet and the third magnet.

An embodiment of an apparatus comprises: a housing; a carrier having a retracted closed position and an ejected open position with respect to the housing, wherein the carrier comprises a first magnet and a second magnet; and a latch having a third magnet located between the first magnet and the second magnet, wherein the latch is configured to cause ejection of the carrier to the ejected open position when causing the similar poles of the first magnet and the third magnet to face each other, and the latch is configured to cause retraction of the carrier when causing the similar poles of the second magnet and the third magnet to face each other.

Although the subject matter has been described in language specific to structural features and/or acts, it is to be understood that the subject matter defined in the appended claims is not necessarily limited to the specific features or acts described above. Rather, the specific features and acts described above are disclosed as examples of implementing the claims and other equivalent features and acts are intended to be within the scope of the claims.

It will be understood that the benefits and advantages described above may relate to one embodiment or may relate to several embodiments. The embodiments are not limited to those that solve any or all of the stated problems or those that have any or all of the stated benefits and advantages.

Aspects of any of the examples described above may be combined with aspects of any of the other examples described to form further examples without losing the effect sought.

The term 'comprising' is used herein to mean including the method blocks or elements identified, but that such blocks or elements do not comprise an exclusive list and a method or apparatus may contain additional blocks or elements.

It will be understood that the above description is given by way of example only and that various modifications may be made by those skilled in the art. The above specification, examples and data provide a complete description of the structure and use of exemplary embodiments. Although various embodiments have been described above with a certain degree of particularity, or with reference to one or more individual embodiments, those skilled in the art could make numerous alterations to the disclosed embodiments without departing from the spirit or scope of this specification. In particular, the individual features, elements, or parts described in the context of one example may also be connected in any combination to any other example.

The invention claimed is:

1. An apparatus comprising:
 a housing;
 a carrier having a retracted closed position and an ejected open position with respect to the housing, wherein the carrier comprises a first magnet and a second magnet; and
 a latch having two states and having a third magnet located between the first magnet and the second magnet, the latch and the third magnet, together, configured to move transversely in relation to a reciprocating direction of motion of the carrier;

wherein in a first state of the two states of the latch the carrier is in the retracted closed position due to a magnetic coupling between the first magnet and the third magnet, and in a second state of the two states of the latch the carrier is in the ejected open position due to a magnetic coupling between the second magnet and the third magnet.

2. The apparatus according to claim 1, wherein the carrier comprises a front portion and a back portion, wherein the first magnet is located in the front portion, the first magnet comprising a first magnetic pole element and a second magnetic pole element, wherein the first magnetic pole element has an adverse magnetic polarity to that of the second magnetic pole element, wherein the second magnetic pole element is located between the first magnetic pole element and the carrier, wherein the second magnet is located in the back portion, the second magnet comprising a third magnetic pole element and a fourth magnetic pole element, wherein the third magnetic pole element has an adverse magnetic polarity to that of the fourth magnetic pole element, wherein the fourth magnetic pole element is located between the third magnetic pole element and the carrier; and wherein the third magnet comprises a fifth magnetic pole element and a sixth magnetic pole element, wherein the fifth magnetic pole element has an adverse magnetic polarity to that of the sixth magnetic pole element, wherein the fifth magnetic pole element and the sixth magnetic pole element are attached side by side to the latch.

3. The apparatus according to claim 2, wherein responsive to the latch being switched from the first state to the second state, the fifth magnetic pole element is caused to face the first magnetic pole element causing ejection of the carrier due to a repelling magnetic force between the fifth magnetic pole element and the first magnetic pole element, and the carrier is caused to move to the ejected open position due to an attractive magnetic force between the third magnetic pole element and the sixth magnetic pole element.

4. The apparatus according to claim 3, wherein responsive to the latch being switched from the second state to the first state, the sixth magnetic pole element is caused to face the fourth magnetic pole element causing retracting of the carrier due to a repelling magnetic force between the sixth magnetic pole element and the fourth magnetic pole element, and the carrier is caused to move to the retracted closed position due to an attractive magnetic force between the fifth magnetic pole element and the second magnetic pole element.

5. The apparatus according to claim 2, wherein the second magnetic pole element, the fourth magnetic pole element and the sixth magnetic pole element are magnetic north poles.

6. The apparatus according to claim 2, wherein the first magnetic pole element, the third magnetic pole element and the fifth magnetic pole element are magnetic north poles.

7. The apparatus according to claim 1, wherein the carrier is structured to releasably receive at least one removable data storage medium.

8. The apparatus according to claim 7, wherein the carrier is structured to releasably receive at least one of an integrated circuit card, a subscriber identity module card, a secure digital card, a memory card, a storage card, an expanded external memory card, a compact disc, a digital versatile disc and a Blue-ray Disc.

9. The apparatus according to claim 1, wherein the housing comprises at least one guide element configured to connect the carrier to the housing in a slidable manner.

10. The apparatus according to claim 1, wherein the apparatus comprises at least one roller element configured to connect the carrier to the housing in a movable manner.

11. The apparatus according to claim 1, wherein the transverse movement of the latch in relation to the reciprocating direction of motion of the carrier between the first state and the second state causes the carrier to move to the retracted closed position or to the ejected open position due to a magnetic force.

12. The apparatus according to claim 1, wherein the latch comprises an operating element which enables the latch to be moved between the first state and the second state due to an external force applied to the operating element.

13. The apparatus according to claim 1, wherein the latch comprises an operating element and a spring which enable the latch to be moved to the second state by an external force applied to the operating element and returned to the first state by the spring force of the spring.

14. The apparatus according to claim 1, wherein the carrier comprises a card carrier.

15. The apparatus according to claim 1, wherein the carrier comprises a flash.

16. The apparatus according to claim 1, wherein the apparatus is a card connector for an electronic communication device.

17. The apparatus according to claim 1, further comprising an electronic device, the electronic device comprising the carrier, the latch, the first magnet, the second magnet and the third magnet.

18. An electronic apparatus comprising:
a housing;
a carrier configured to carry at least one removable data storage medium, the carrier having a retracted closed position and an ejected open position with respect to the housing, wherein the carrier comprises a first magnet and a second magnet; and
a latch having two states and having a third magnet located between the first magnet and the second magnet, the latch and the third magnet, together, configured to move transversely in relation to a reciprocating direction of motion of the carrier;
wherein in a first state of the two states of the latch the carrier is in the retracted closed position due to a magnetic coupling between the first magnet and the third magnet, and in a second state of the two states of the latch the carrier is in the ejected open position due to a magnetic coupling between the second magnet and the third magnet.

19. An apparatus comprising:
a housing;
a carrier having a retracted closed position and an ejected open position with respect to the housing, wherein the carrier comprises a first magnet and a second magnet; and
a latch having a third magnet located between the first magnet and the second magnet, wherein the latch is configured to cause ejection of the carrier to the ejected open position responsive to similar poles of the first magnet and the third magnet facing each other, and the latch is configured to cause retraction of the carrier responsive to similar poles of the second magnet and the third magnet facing each other, the latch and the third magnet, together, configured to move transversely in relation to a reciprocating direction of motion of the carrier.

\* \* \* \* \*